United States Patent
Wang et al.

(10) Patent No.: US 6,566,023 B2
(45) Date of Patent: May 20, 2003

(54) PHASE SHIFTING CIRCUIT MANUFACTURE METHOD AND APPARATUS

(75) Inventors: Yao-Ting Wang, Atherton, CA (US); Yagyensh C. Pati, Woodside, CA (US)

(73) Assignee: Numerical Technology, Inc., San Jose, CA (US)

( * ) Notice: Subject to any disclaimer, the term of this patent is extended or adjusted under 35 U.S.C. 154(b) by 0 days.

(21) Appl. No.: 10/154,858

(22) Filed: May 24, 2002

(65) Prior Publication Data

US 2002/0168578 A1 Nov. 14, 2002

Related U.S. Application Data

(62) Division of application No. 09/839,672, filed on Apr. 20, 2001, now Pat. No. 6,436,590, which is a continuation of application No. 09/732,407, filed on Dec. 7, 2000, now Pat. No. 6,420,074, which is a continuation of application No. 09/617,613, filed on Jul. 17, 2000, now Pat. No. 6,258,493, which is a continuation of application No. 09/229,455, filed on Jan. 12, 1999, now Pat. No. 6,228,539, which is a continuation of application No. 08/931,921, filed on Sep. 17, 1997, now Pat. No. 5,858,580.

(60) Provisional application No. 60/025,972, filed on Sep. 18, 1996.

(51) Int. Cl.$^7$ .............................. G03F 9/00; G06F 17/50
(52) U.S. Cl. .............................................. 430/5; 716/19
(58) Field of Search ........................... 430/5, 311, 322, 430/394; 716/19, 20, 21

(56) References Cited

U.S. PATENT DOCUMENTS

| | | | |
|---|---|---|---|
| 4,037,918 A | 7/1977 | Kato .......................... | 350/3.5 |
| 4,456,371 A | 6/1984 | Lin ............................. | 355/71 |
| 5,242,770 A | 9/1993 | Chen et al. ..................... | 430/5 |

(List continued on next page.)

FOREIGN PATENT DOCUMENTS

| | | |
|---|---|---|
| DE | 195 45 163 A1 | 6/1996 |
| EP | 0 464 492 A1 | 1/1992 |
| EP | 0 653 679 A2 | 5/1995 |
| EP | 0 698 821 | 2/1996 |
| JP | 62067547 | 3/1987 |
| JP | 2-140743 | 5/1990 |
| JP | 1283925 | 2/1991 |
| JP | 6-67403 | 3/1994 |
| JP | 8-51068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |

OTHER PUBLICATIONS

Wang, R., et al., "Polarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

Pistor, T., "Rigorous 3D Simulation of Phase Defects in Alternating Phase-Shifting Masks", Panoramic Technology Inc. (13 pages).

(List continued on next page.)

Primary Examiner—S. Rosasco
(74) Attorney, Agent, or Firm—Mark A. Haynes; Haynes Beffel & Wolfeld LLP

(57) ABSTRACT

A two mask process for small dimension features on an integrated circuit improves manufacturability and design tolerance. The first mask is an opaque-field phase shift mask and the second mask is a single phase structure mask. A phase shift window is aligned with the opaque field using a phase shift overlap area on the opaque field. The phase shift mask primarily defines regions requiring phase shifting. The single phase structure mask primarily defines regions not requiring phase shifting. The single phase structure mask also prevents the erasure of the phase shifting regions and prevents the creation of undesirable artifact regions that would otherwise be created by the phase shift mask.

24 Claims, 5 Drawing Sheets

U.S. PATENT DOCUMENTS

| | | |
|---|---|---|
| 5,302,477 A | 4/1994 | Dao et al. .................. 430/5 |
| 5,308,741 A | 5/1994 | Kemp ..................... 430/312 |
| 5,316,878 A | 5/1994 | Saito et al. ................ 430/5 |
| 5,324,600 A | 6/1994 | Jinbo et al. ............... 430/5 |
| 5,326,659 A | 7/1994 | Liu et al. .................. 430/5 |
| 5,328,807 A | 7/1994 | Tanaka et al. .......... 430/311 |
| 5,334,542 A | 8/1994 | Saito et al. .............. 437/40 |
| 5,352,550 A | 10/1994 | Okamoto et al. ......... 430/5 |
| 5,364,716 A | 11/1994 | Nakagawa et al. ....... 430/5 |
| 5,424,154 A | 6/1995 | Borodovsky ............... 430/5 |
| 5,472,814 A | 12/1995 | Lin .......................... 430/5 |
| 5,480,746 A | 1/1996 | Jinbo et al. ............... 430/5 |
| 5,496,666 A | 3/1996 | Chu et al. ................. 430/5 |
| 5,498,579 A | 3/1996 | Borodovsky et al. .... 437/250 |
| 5,503,951 A | 4/1996 | Flanders et al. .......... 430/5 |
| 5,523,186 A | 6/1996 | Lin et al. .................. 430/5 |
| 5,527,645 A | 6/1996 | Pati et al. ................. 430/5 |
| 5,532,090 A | 7/1996 | Borodovsky ............... 430/5 |
| 5,537,648 A | 7/1996 | Liebmann et al. ...... 395/500 |
| 5,538,815 A | 7/1996 | Oi et al. ................... 430/5 |
| 5,539,568 A | 7/1996 | Lin et al. ................ 359/285 |
| 5,553,273 A | 9/1996 | Liebmann ............... 395/500 |
| 5,565,286 A | 10/1996 | Lin .......................... 430/5 |
| 5,572,598 A | 11/1996 | Wihl et al. .............. 382/144 |
| 5,573,890 A | 11/1996 | Spence .................... 430/311 |
| 5,595,843 A | 1/1997 | Dao .......................... 430/5 |
| 5,620,816 A | 4/1997 | Dao .......................... 430/5 |
| 5,631,110 A | 5/1997 | Shioiri et al. ............. 430/5 |
| 5,635,316 A | 6/1997 | Dao .......................... 430/5 |
| 5,636,131 A | 6/1997 | Liebmann et al. ...... 364/490 |
| 5,663,017 A | 9/1997 | Schinella et al. ......... 430/5 |
| 5,663,893 A | 9/1997 | Wampler et al. ........ 364/491 |
| 5,702,848 A | 12/1997 | Spence .................... 430/5 |
| 5,705,301 A | 1/1998 | Garza et al. ............. 430/5 |
| 5,707,765 A | 1/1998 | Chen ........................ 430/5 |
| 5,725,969 A | 3/1998 | Lee ........................... 430/5 |
| 5,740,068 A | 4/1998 | Liebmann et al. ...... 364/489 |
| 5,761,075 A | 6/1998 | Oi et al. ................. 364/488 |
| 5,766,804 A | 6/1998 | Spence .................... 430/5 |
| 5,766,806 A | 6/1998 | Spence .................... 430/5 |
| 5,795,688 A | 8/1998 | Burdorf et al. .......... 430/30 |
| 5,801,954 A | 9/1998 | Le et al. ................. 364/488 |
| 5,804,340 A | 9/1998 | Garza et al. ............. 430/5 |
| 5,807,649 A | 9/1998 | Liebmann et al. ......... 430/5 |
| 5,815,685 A | 9/1998 | Kamon .................... 395/500 |
| 5,821,014 A | 10/1998 | Chen et al. .............. 430/5 |
| 5,827,623 A | 10/1998 | Ishida et al. ............. 430/5 |
| 5,849,440 A | 12/1998 | Lucase et al. ............ 430/5 |
| 5,858,580 A | 1/1999 | Wang et al. .............. 430/5 |
| 5,885,734 A | 3/1999 | Pierrat et al. ............. 430/5 |
| 5,994,002 A | 11/1999 | Matsuoka ................ 430/5 |
| 6,144,081 A | 11/2000 | Hsu et al. ............... 257/397 |
| 6,185,727 B1 | 2/2001 | Liebmann ................ 716/19 |
| 6,228,539 B1 | 5/2001 | Wang et al. .............. 430/5 |
| 6,258,493 B1 | 7/2001 | Wang et al. .............. 430/5 |
| 2001/0000240 A1 | 4/2001 | Wang et al. .............. 430/5 |
| 2001/0028985 A1 | 10/2001 | Wang et al. .............. 430/5 |

OTHER PUBLICATIONS

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Schmidt, R., et al., "Impact of Coma on CD Control for Multiphase PSM Designs", AMD, ASML (10 pages).

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, 2991–2997, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Ackmann, P., et al., "Phase Shifting and Optical Proximity Corrections to Improve CD Control on Logic Devices in Manufacturing for Sub 0.35 um I–Line", Advance Micro Devices (8 pages).

Matsuoka, K., et al., "Application of Alternating Phase–Shifting Mask to 0.16 um CMOS Logic Gate Patterns", Matsushita Electric Ind. Co., Ltd. (9 pages).

Spence, C., et al., "Detection of 60(degree) Phase Defects on Alternating PSMs", Advanced Micro Devices, KLA–Tencor, DuPont RTC (2 pages).

Sugawara, M., et al., "Defect Printability Study of Attenuated Phase–Shifting Masks for Specifying Insepction Sensitivity", Sony Corporation, Kanagawa, Japan (16 pages).

Schmidt, R., et al., "Impact of Coma on CD Control for Multiphase PSM Designs", AMD, ASML (11 pages).

Erdmann, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—A Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, Arch Chemicals, Finle Technologies, KLATencor Corp. (10 pages).

Ronse, K., et al., "Thin Film Interference Effects in Phase Shifting Masks Causing Phase and Transmittance Errors", IMEC (15 pages).

Rosenbluth, A., et al., "Optimum Mask and Source Patterns to Print a Given Shape", IBM (17 pages).

Sakata, M., et al., "A Novel Radiaion Sensitive Spin–on–Glass Convertible into SiO2 and the Simple Fabrication Process Using It", Oki Electric Industry Co. Ltd. (3 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1=–.3 Lithogrpahy", Canon Inc. (13 pages).

Vandenberghe, G., et al., "(Sub–)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectornics, University of California Berkeley (12 pages).

Casey, Jr., J.D., et al., "Chemically Enhanced FIB Repair of Opaque Defects on Molybdenum Silicide Photomasks", SPIE, vol. 3236, pp. 487–497 (1997).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "Improving Resolution in Photolithography with a Phase–Shifting Mask", IEEE, Transactions On Electron Devices, vol. ED–29, No. 12, pp. 1828–1836, Dec. 1982.

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Produce Sizes in Openings in Photo Images Smaller Than Lithographic Minimum Size", IBM Technical Disclosure Bulletin, vol. 29, No. 3, p. 1328, Aug. 1986.

Terasawa, T., et al., "0.3–Micron Optical Lithography Using a Phase–Shifting Mask", SPIE, Optical/Laser Microlithography II, vol. 1088, pp. 25–33, Mar. 1989.

Buraschi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Jinbo, H., et al., "0.2um of Less i–Line Lithography by Phase–Shifting–Mask Technology", IEEE, pp. 33.3.1–33.3.4 (1990).

Neureuther, A., "Modeling Phase Shifting Masks", SPIE, 10th Annual Symposium On Microlithography, vol. 1496, pp. 80–85 (1990).

Toh, K., et al., "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9um2 Super Low Power SRAM Cell Using a New Phase–Shift Lithgoraphy", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990)

Watanabe, H., et al., "Transparent Phase Shifting Mask", IEDM, pp. 33.2.1–33.2.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices And Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Burggraaf, P., "Four More Significant Japanese Advances in Phase Shfiting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Henke, W., et al., "A Study of Reticle Defects Imaged Into Three–Dimensional Developed Profiles of Positive Photoresist Using the Solid Lithography Simulator", Microelectronics Eng., vol. 14, pp. 283–297 (1991).

Asai, S., et al., "High Performance Optical Lithography Using a Separated Light Source", J. Vac. Sci. Technol. B, vol. 10, No. 6, pp. 3023–3026, Nov./Dec. 1992.

Jinbo, H., et al., "Application of Blind Method to Phase–Shifting Lithography", IEEE, 1992 Symposium On VLSI Technology Digest Of Technical Papers, pp. 112–113 (1992).

Ohtsuka, H., et al., "Phase Defect Repair Method for Alternating Phase Shift Masks Conjugate Twin–Shifter Method", Jpn. J. Appl. Phys., vol. 31, pp. 4143–4149 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Pierrat, C., et al., "Phase–Shifting Mask Topography Effects on Lithographic Image Quality", IEEE, pp. 3.3.1–3.3.4 (1992).

Burggraaf, P., "Lithography's Leading Edge, Part 1: Phase–Shift Technology and Part 2: I–Line and Beyond", Semiconductor International, pp. 43–47 and 52–56, Feb. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Ham, Y.M., et al., "Dependence of Defects in Optical Lithography", Jpn. J. Appl. Phys., vol. 31, pp. 4137–4142 (1992).

Brunner, T., et al., "170nm Gates Fabricated by Phase–Shift Mask and Top Anti–Reflector Process", SPIE, Optical/Laser Microlithography VI, vo. 1927, pp. 182–189 (1993).

Brunner, T., "Rim Phase–Shift Mask Combined with Off–Axis Illumination: A Path to 0.5(lampda)/Numerical Aperture Geometries", Optical Engineering, vol. 32, No. 10, pp. 2337–2343, Oct. 1993.

Lin, B.J., "Phase–Shifting Masks Gain an Edge", IEEE Circuits & Devices, pp. 28–35, Mar. 1993.

Liu, H.Y., et al., "Fabrication of 0.1um T–Shaped Gates by Phase–Shifting Optical Lithography", SPIE, Optical/Laser Microlithography VI, vol. 1927, pp. 42–52 (1993).

Nistler, J., et al., "Phase Shift Mask Defect Printability Analysis", Proceedings Of The Microlithography Seminar Interface '93 , OCG Microelectornic Materials, Inc., pp. 11–28 (1993).

Rieger, M., et al., "System for Lithography Proximity Compensation", Precim Comapny, Portland, Oregon, Sep. 1993 (28 pages).

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Maskmaking and its Application", J. Vac. Sci. Technol. B, vol. 11, No. 6, pp. 2669–2674, Nov./Dec. 1993.

Wiley, J., et al., "Device Yield and Reliability by Specification of Mask Defects", Solid State Technology, vol. 36, No. 7, pp. 65–66, 70, 72, 74, 77 Jul. 1993.

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno, F., et al., "Practical Phase–Shifting Mask Technology for 0.3um Large Scale Integrations", J. Vac. Sci. Technol. B, vol. 12, No. 6, pp. 3799–3803, Nov./Dec. 1994.

Nistler, J., et al., "Large Area Optical Design Rule Checker for Logic PSM Application", SPIE, Photomask And X–Ray Mask Technology, vol. 2254, pp. 78–92 (1994).

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Pierrat, C., et al., "A Rule–Based Approach to E–Beam and Process–Induced Proximity Effect Correction for Phase–Shfting Mask Fabrication", SPIE, vol. 2194, pp. 298–309 (1994).

Spence, C., et al., "Automated Determination of CAD Layout Failures Through Focus: Experiment and Simulation", SPIE, vol. 2197, pp. 302–313 (1994).

Stirniman, J., et al., "Wafer Proximity Correction and Its Impact on Mask–Making", Bacus News, vol. 10, Issue 1, pp. 1, 3–7, 10–12, Jan. 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, vo. 2440, pp. 192–206, Feb. 1995.

Karklin, L., "A Comprehensive Simulation Study of the Photomask Defects Printability", SPIE, vol. 2621, pp. 490–504 (1995).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25 um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512 pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Wiley, J., et al., "The Effect of Off–Axis Illumination on the Printability of Opaque and Transparent Reticle Defects", SPIE, vol. 2512, pp. 432–440 (1995).

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Brunner, T., et al., "Approximate Models for Resist Processing Effects", SPIE, vol. 2726, pp. 198–207, Mar. 1996.

Chang, K., et al., "Accurate Modeling of Deep Submicron Interconnect Technology", TMA Times, vol. IX, No. 3 (1997).

Gans, F., et al., "Printability and Repair Techniques for DUV Photomasks", SPIE, Proceedings Of The 17th Annual Symposium On Photomask Technology And Management, vol. 3236, pp. 136–141 (1997).

Ibsen, K., et al., "Clear Field Reticle Defect Diposition for Advanced Sub–Half Micron Lithography", SPIE, Proceedings Of The 17th Annual Symposium On Photomask Technology And Management, vol. 3236, pp. 124–135 (1997).

Ishiwata, N., et al., "Novel Alternating Phase Shift Mask with Improved Phase Accuracy", SPIE, Proceedings Of The 17th Annual Symposium On Photomask Technology And Management, vol. 3236, pp. 243–249 (1997).

Morimoto, H., et al., "Next Generation Mask Strategy— Technologies are Ready for Mass Production of 256MDRAM?", SPIE, vol. 3236, pp. 188–189 (1997).

Park, C., et al., "An Automatic Gate CD Control for a Full Chip Scale SRAM Device", SPIE, vol. 3236, pp. 350–357 (1997).

Pati, Y.C., et al., "Exploiting Structure in Fast Aerial Image Computation for Integrated Circuit Patterns", IEEE Transactions On Semiconductor Manufacturing, vol. 10, No. 1, pp. 62–74, Feb. 1997.

Roman, B., et al., "Implications of Device Processing on Photomask CD Requirements", SPIE, vol. 3236 (1997) (Abstract Only).

Vacca, A., et al., "100nm Defect Detection Using a Dynamically Programmable Image Processing Algorithm", SPIE, vol. 3236 (1997) (Abstract Only).

PHASE SHIFTING CIRCUIT MANUFACTURE METHOD AND APPARATUS

RELATED APPLICATION DATA

This application is a divisional of application Ser. No. 09/839,672, filed Apr. 20, 2001 (now U.S. Pat. No. 6,436, 590); which is a continuation of application Ser. No. 09/732, 407, filed Dec. 7, 2000 (which is now U.S. Pat. No. 6,420,074); which is a continuation of application Ser. No. 09/617,613, filed Jul. 17, 2000 (now U.S. Pat. No. 6,258, 493); which is a continuation of application Ser. No. 09/229, 455, filed Jan. 12, 1999 (now U.S. Pat. No. 6,228,539); which is a continuation of application Ser. No. 08/931,921, filed Sep. 17, 1997 (now U.S. Pat. No. 5,858,580); which application claims the benefit of the filing date of U.S. Provisional Application No. 60/025,972, filed Sep. 18, 1996.

BACKGROUND OF THE INVENTION a. The Field of the Invention

This invention relates to the field of integrated circuit manufacturing. In particular, the invention relates to phase shifting techniques in the optical lithography patterning process.

b. Background Information

Lithography processing is a required and essential technology when manufacturing conventional integrated circuits. Many lithography techniques exist, and all lithography techniques are used for the purpose of defining geometries, features, lines, or shapes onto an integrated circuit die or wafer. In general, a radiation sensitive material, such as photoresist, is coated over a top surface of a die or wafer to selectively allow for the formation of the desired geometries, features, lines, or shapes.

One known method of lithography is optical lithography. The optical lithography process generally begins with the formation of a photoresist layer on the top surface of a semiconductor wafer. A mask having fully light non-transmissive opaque regions, which are usually formed of chrome, and fully light transmissive clear regions, which are usually formed of quartz, is then positioned over the aforementioned photoresist coated wafer. Light is then shone on the mask via a visible light source or an ultra-violet light source. In almost all cases, the light is reduced and focused via an optical lens system which contains one or several lenses, filters, and or mirrors. This light passes through the clear regions of the mask and exposes the underlying photoresist layer, and is blocked by the opaque regions of the mask, leaving that underlying portion of the photoresist layer unexposed. The exposed photoresist layer is then developed, typically through chemical removal of the exposed/non-exposed regions of the photoresist layer. The end result is a semiconductor wafer coated with a photoresist layer exhibiting a desired pattern. This pattern can then be used for etching underlying regions of the wafer.

In recent years, there has been great demand to increase the number of transistors on a given size wafer. Meeting this demand has meant that integrated circuit designers have had to design circuits with smaller minimum dimensions. However, prior to the work of Levenson, et. al., as reported in "Improving Resolution in Photolithography with a Phase Shifting Mask," IEEE Transactions on Electron Devices, VOL., ED-29, November 12, December 1982, pp. 1828–1836, it was found that the traditional optical lithography process placed real limits on the minimum realizable dimension due to diffraction effects. For, at integrated circuit design feature sizes of 0.5 microns or less, the best resolution has demanded a maximum obtainable numerical aperture (NA) of the lens systems. However, as the depth of field of the lens system is inversely proportional to the NA, and since the surface of the integrated circuit could not be optically flat, good focus could not be obtained when good resolution was obtained and vice versa. Thus, as the minimum realizable dimension is reduced in manufacturing processes for semiconductors, the limits of optical lithography technology are being reached. In particular, as the minimum dimension approaches 0.1 microns, traditional optical lithography techniques will not work effectively.

One technique, described by Levenson, et al., to realize smaller minimum device dimensions, is called phase shifting. In phase shifting, the destructive interference caused by two adjacent clear areas in an optical lithography mask is used to create an unexposed area on the photoresist layer. This is accomplished by making use of the fact that light passing through a mask's clear regions exhibits a wave characteristic such that the phase of the amplitude of the light exiting from the mask material is a function of the distance the light travels in the mask material. This distance is equal to the thickness of the mask material. By placing two clear areas adjacent to each other on a mask, one of thickness $t_1$ and the other of thickness $t_2$, one can obtain a desired unexposed area on the photoresist layer through interference. For, by making the thickness $t_2$, such that $(n-1)(t_2)$ is exactly equal to ½ $\lambda$, where $\lambda$ is the wavelength of the light shone through the mask material, and n is the refractive index of the material of thickness $t_1$, the amplitude of the light exiting the material of thickness $t_2$ will be 180 degrees out of phase with the light exiting the material of thickness $t_1$. Since the photoresist material is responsive to the intensity of the light, and the opposite phases of light cancel where they overlap, a dark unexposed area will be formed on the photoresist layer at the point where the two clear regions of differing thicknesses are adjacent.

Phase shifting masks are well known and have been employed in various configurations as set out by B. J. Lin in the article, "Phase-Shifting Masks Gain an Edge," Circuits and Devices, March 1993, pp. 28–35. The configuration described above has been called alternating phase shift masking (APSM). In comparing the various phase shifting configurations, researchers have shown that the APSM method can achieve dimension resolution of 0.25 microns and below.

One problem with the APSM method is that dark lines on the photoresist layer are created at all areas corresponding to 0 degree to 180 degree transitions in the mask. These dark lines, unless part of the desired end structure, should be erased at some point in the processing of the wafer.

Another problem is that the APSM method does not lend itself well to process technology shrinking. Traditionally, designers design an integrated circuit for a predetermined minimum realizable dimension. However, because process technologies can require a considerable amount of time to fine tune, the integrated circuit is first manufactured using a process technology that does not support the designed for speed and has a larger minimum dimension. Often, a first set of masks are created to manufacture the integrated circuits at the larger dimension. As the process technology improves, the minimum realizable dimension decreases. Additional mask sets are created for each new minimum dimension process. These masks are generally created using software driven machines to automatically manufacture the masks given the design features needed. However, due to the complexity of the masks needed to erase the aforementioned unwanted dark lines created when the APSM method is used, these masks have not generally been able to be designed automatically by mask creation programs. This has required mask designers to expend large amounts of time and money manually creating mask layouts when the APSM method is used.

Spence, U.S. Pat. No. 5,573,890, reveals one method to overcome these problems. Spence discloses a system in which phase shifting is used to shrink integrated circuit design, specifically to shrink transistor gate lengths, where the masks used are computer designed. The computer designs a mask or masks which achieve(s) the required minimum dimension and which provide for the removal of the unwanted dark lines created by the APSM method. In a disclosed single mask method, Spence uses transition regions to compensate for the unwanted dark lines that would have been produced where there were 0 degree to 180 degree transitions in the mask. The problem with this single mask method is that the single mask that results is complicated and difficult to manufacture. Further, the mask that is produced is very unlike the design of the circuit from a visual standpoint, thus making it difficult for designers to visually double check their work.

Spence also discloses a two mask method which is illustrated in FIG. 1. Old mask 100 represents a typical mask that would be used to produce a structure having a transistor of old gate length 109, which is wide enough to be achieved using traditional optical lithography techniques with no phase shifting. New gate length 159 is the desired transistor gate length that is smaller than the smallest dimension realizable through the process of traditional optical lithography. Spence uses a phase shift and structure mask 110 and a trim mask 120 in order to achieve the new gate length 159 and to remove the unwanted dark lines created by the phase shift method, respectively.

The phase shift and structure mask 110 is designed such that it contains both a structure chrome area 113, which is the same shape as the desired polysilicon structure of the circuit, and a phase shifter consisting of a 180 degree phase clear area 112 adjacent to a 0 degree phase clear area 111. When light is shined on the phase shift and structure mask 110, the phase shift and structure image 130 is created on the underlying photoresist layer. The phase shift and structure image 130 contains the desired final structure dark area 133 and the desired dark area 132, but also includes unwanted artifacts 135 created by interference at the transitions between the 180 degree phase clear area 112 and the 0 degree phase clear area 111.

Thus, in order to remove these unwanted artifacts 135 and achieve the desired result image 150, Spence discloses using the trim mask 120 solely to perform this function. The trim mask 120 consists of a chrome area 123 and an erasure light area 122. When light is shown on the trim mask 120, the trim image 140 is created on the photoresist layer. This trim image 140 contains an erasure light area 142 which serves to erase the unwanted artifacts 135. The result image 150 represents the final image created on the photoresist layer as a result of the two mask method disclosed by Spence.

Spence's two mask method has several problems. By combining the production of the final structure and the phase shifting onto a single mask, this method introduces a large number of possible conflicts in the design rules of the circuit as a whole. This increase in conflicts makes it much more difficult for the computer to determine a solution to the shrinking of the circuit design that is within the design rules parameters. In addition, this increase in conflicts may in some instances produce a situation where no shrunk design is possible. Furthermore, combining the structure and phase shifting on one of the two masks increases the overall complexity of this mask thus making it more difficult to manufacture and inspect. Finally, combining structure and phase shifting on a single mask results in the design of a mask that does not look like the structure masks used for the earlier larger versions of the designed circuit. As a result, it is more difficult for the designers of the integrated circuit to visually check their work.

Therefore, what is desired is an improved method of using phase shifting to achieve smaller minimum realizable dimensions.

A SUMMARY OF THE INVENTION

A method and apparatus for creating a phase shifting mask and a structure mask for small dimension integrated circuit designs is described.

One embodiment of the invention includes using a two mask process. The first mask is a phase shift mask and the second mask is a single phase structure mask. The phase shift mask primarily defines regions requiring phase shifting. The single phase structure mask primarily defines regions not requiring phase shifting. The single phase structure mask also prevents the erasure of the phase shifting regions and prevents the creation of undesirable artifact regions that would otherwise be created by the phase shift mask.

In one embodiment, a set of masks defines a layer of material in an integrated circuit, including first and second masks. The first mask has phase shifting areas in respective openings in an opaque field which define a first structure in said layer. The phase shifting areas include a first phase shift area and a second phase shift area, where destructive interference occurs between said first and second phase shift areas. In embodiments of the present invention, the first phase shift area is aligned with said respective opening in said opaque field by a phase shift mask overlap area. The second mask defines other structure for said layer and prevents erasure of said first structure.

Although many details have been included in the description and the figures, the invention is defined by the scope of the claims. Only limitations found in those claims apply to the invention.

A BRIEF DESCRIPTION OF THE DRAWINGS

The figures illustrate the invention by way of example, and not limitation. Like references indicate similar elements.

Although many details have been included in the description and the figures, the invention is defined by the scope of the claims. Only limitations found in those claims apply to the invention.

THE DESCRIPTION a. An Overview of an Embodiment of the Invention

A method and apparatus for creating a phase shift mask and a structure mask for shrinking integrated circuit designs is described. One embodiment of the invention includes using a two mask process. The first mask is a phase shift mask and the second mask is a single phase structure mask. The phase shift mask primarily defines regions requiring phase shifting. The single phase structure mask primarily defines regions not requiring phase shifting. The single phase structure mask also prevents the erasure of the phase shift regions and prevents the creation of undesirable artifact regions that would otherwise be created by the phase shift mask. Both masks are derived from a set of masks used in a larger minimum dimension process technology.

The following describes the use of a technique, in one embodiment of the invention, to shrink a design of a polysilicon layer for use in a transistor. The design is shrunk from a first process technology that does not use phase shifting to a second process technology that does use phase shifting. A phase shift mask, for the polysilicon layer, is created solely to make the gate of the transistor; the length of the gate is the minimum distance for the second process technology. This phase shift mask does not contain any of the structural elements of the remainder of the circuit. The semiconductor substrate is exposed using the first mask. A structure mask is created to make the remainder of the layer of the integrated circuit and to protect the desired phase shift regions. The semiconductor substrate is also exposed using this second mask. The first mask and the second mask are generated directly from the information used to generate the mask set for the first process technology.

In one embodiment, the second mask is exactly the same mask as was used in the first process technology. In another embodiment, the second mask has the same pattern used for the first process technology except that the dimensions used have been shrunk. In another embodiment, the second mask used has a similar pattern to the mask used for the first process technology except that a few modifications to the pattern have been made.

b. Gate Shrinking

Figure 2:
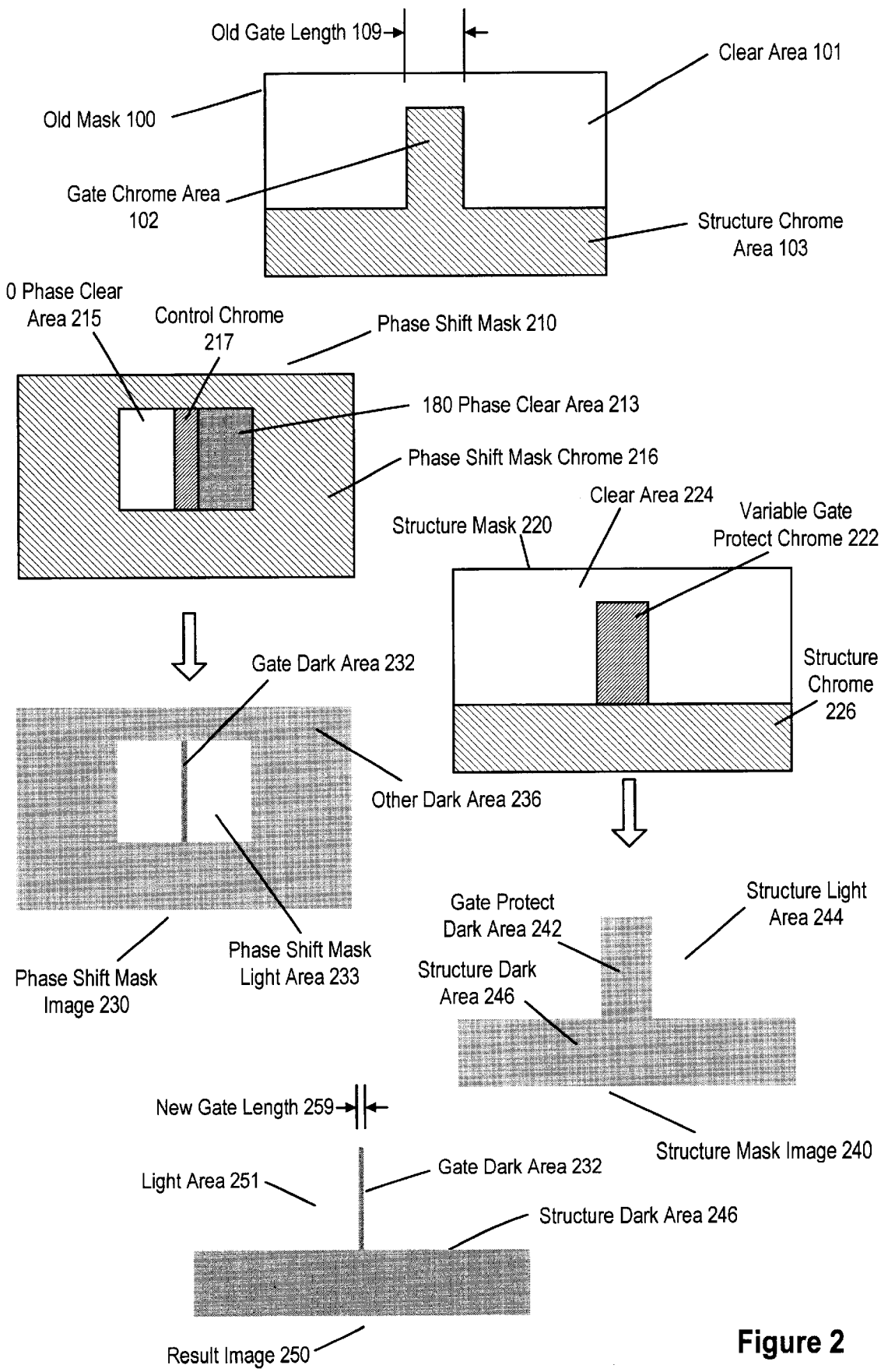
FIG. 2 illustrates one embodiment of a dual mask phase shifting process for shrinking transistor gates in an integrated circuit.

FIG. 2 illustrates one embodiment of a dual mask phase shifting process for shrinking transistor gates in an integrated circuit. The following paragraphs first describe the elements in FIG. 2, then the relationships between those elements, and then the functions of the various elements of the system.

FIG. 2 includes the following elements: An old mask 100, a phase shift mask 210, a structure mask 220, a phase shift mask image 230, a structure mask image 240, and a result image 250. The old mask 100 includes a clear area 101, a gate chrome area 102, a structure chrome area 103, and an old gate length 109. The phase shift mask 210 includes a 180 phase clear area 213, a 0 phase clear area 215, phase shift mask chrome 216, and control chrome 217. The structure mask 220 includes variable gate protect chrome 222, a clear area 224, and structure chrome 226. The phase shift mask image 230 includes a gate dark area 232, a phase shift mask light area 233, and an other dark area 236. The structure mask image 240 includes a gate protect dark area 242, a structure light area 244, and a structure dark area 246. The result image 250 includes a light area 251, a gate dark area 232, a structure dark area 246, and a new gate length 259.

Figure 1:
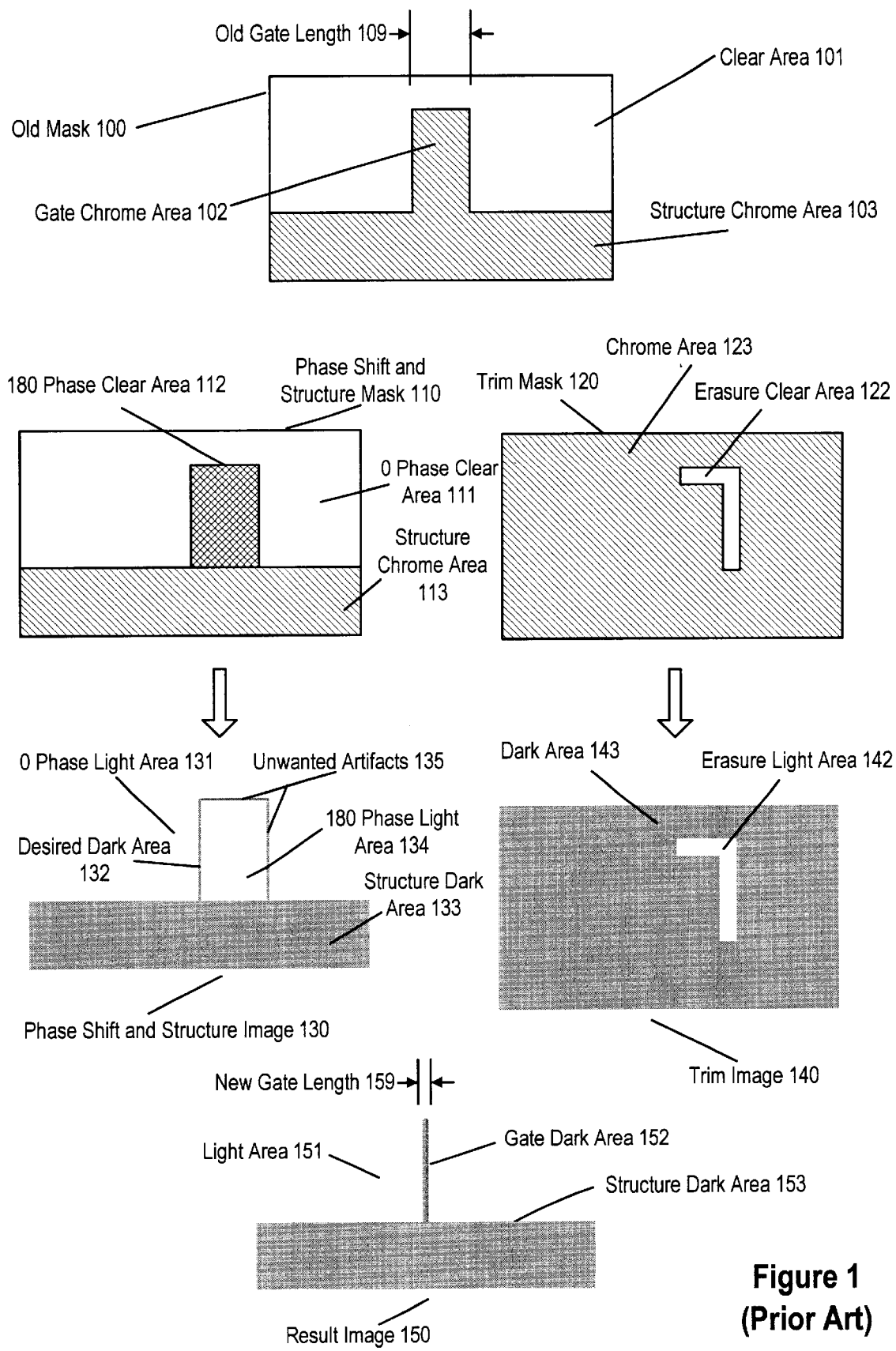
FIG. 1 illustrates a prior art dual mask phase shifting process.

The following paragraphs describe the general relationships between the elements and the main elements of FIG. 2. Old mask 100 is the same, as in FIG. 1.

Phase shift mask 210 represents a top view of a mask used solely to produce a desired circuit dimension that requires the use of interference, such as a shrunk transistor gate length. The 180 degree phase clear area 213 is situated adjacent to the 0 degree phase clear area 215, and each of these clear areas is designed to allow for the full transmission of light through it. The 180 degree phase clear area 213 is of a thickness such that it will create destructive interference at its boundary with the 0 degree phase clear area 215. The control chrome 217 is opaque and does not allow for the transmission of light through it. The control chrome 217 is placed over the center of the boundary between the 180 degree phase clear area 213 and the 0 degree phase clear area 215. The width of this control chrome 217 is variable and can be completely excluded. The width of the control chrome 217 is used to control the shrunk gate length. The phase shift mask chrome 216 covers the remainder of the mask and is also opaque. The sole purpose of the phase shift mask chrome 216 is to ensure the remainder of the photoresist layer is left unexposed such that a structure may later be imprinted on the photoresist layer by the structure mask 220.

Structure mask 220 represents a top view of a mask used to imprint the desired polysilicon structure on the photoresist layer. The structure mask 220 also protects the transistor gate formed by the phase shift mask 210, and erases any unwanted artifacts created by the phase shift mask 210. The clear area 224 is designed to allow the full transmission of light through it, and is designed to cover any areas where unwanted artifacts may have been formed by the phase shift mask 210. The structure chrome 226 is opaque and is shaped and sized to define the desired polysilicon circuit structure. The variable gate protect chrome 222 is of a variable width designed to cover the entire area that the desired gate might occupy in order to protect the gate from inadvertent exposure.

Phase shift mask image 230 represents a top view of a photoresist coated silicon wafer after the wafer has had light shined on it while phase shift mask 210 was directly over the wafer. The light areas depict regions where the photoresist layer was exposed to the light.

Structure mask image 240 represents a top view of a photoresist coated silicon wafer after the wafer has had light shined on it while structure mask 220 was directly over the wafer. The light areas depict regions where the photoresist layer was exposed to the light.

Result image 250 represents the top view of a photoresist coated silicon wafer that has had light shined on it on two separate occasions. Once with phase shift mask 210 directly over the wafer, and once with structure mask 220 directly over the wafer. For the purposes of this invention, it does not matter what sequence is used. Either mask can be used first with no effect on the result image 250.

The following paragraphs describe the function of the elements of FIG. 2. When old mask 100 is placed over a photoresist coated silicon wafer and light is shined onto the mask, the light is transmitted through the clear area 101, and the photoresist material underlying the clear area 101 is exposed. Similarly, the light shined onto the mask is not transmitted through the opaque gate chrome area 102, or the opaque structure chrome area 103, and the photoresist material underlying these areas is thus not exposed. The exposed photoresist layer is now ready for development, typically by chemically removing the exposed regions of the photoresist layer. The end result would be a large dimension semiconductor wafer coated with a photoresist layer exhibiting the desired pattern of transistor gate length and polysilicon structure.

When phase shift mask 210 is placed over a photoresist coated silicon wafer and light is shined onto the mask, the light is transmitted through the 0 degree phase clear area 215 and the 180 degree phase clear area 213. This results in the underlying photoresist material being exposed and creating the phase shift mask light area 233 displayed as part of phase shift mask image 230. The light does not transmit through the phase shift mask chrome 216 and thus the underlying photoresist is not exposed resulting in the other dark area 236 of the phase shift mask image 230. At the boundary between the 180 degree phase clear area 213 and the 0 degree phase clear area 215, destructive interference occurs and the photoresist underlying this boundary is not exposed resulting in the production of the gate dark area 232. The light does not transmit through the control chrome 217 and thus the underlying photoresist is not exposed. The width of the control chrome 217 is variable and can be varied to change the width of the gate dark area 232, and ultimately the new gate length 259. This feature allows for greater control over the width of the gate dark area 232 produced when the design does not require the maximum gate shrinking possible via phase shifting.

When structure mask 220 is placed over a photoresist coated silicon wafer and light is shined onto the mask, the light is transmitted through the clear area 224, and the photoresist material underlying the clear area 224 is exposed. This exposure will erase any unwanted artifacts created by the phase shift mask 210, and produces the structure light area 244 of structure mask image 240. The light does not transmit through the variable gate protect chrome 222 resulting in the gate protect dark area 242. The variable gate protect chrome 222 is sized such that its width is greater than the desired transistor gate length. This ensures that the gate dark area 232 produced by phase shifting will not be destroyed by inadvertent exposure. The light does not transmit through the structure chrome 226 resulting in the production of the structure dark area 246 which correlates to the shape and size of the desired polysilicon structure.

The advantages of this dual mask phase shifting process are significant, and overcome the problems associated with the process disclosed by Spence. These advantages stem from the fact that, the phase shift mask 210 is used solely to produce a desired circuit dimension that requires the use of interference such as a shrunk transistor gate length, while a second separate structure mask 220 is used to produce the remaining polysilicon structure and erase any unwanted artifacts. First, manufacturing of the masks is greatly simplified in that there is no combination of features on one mask to be concerned with. Similarly, since the only critical performance feature of the phase shift mask 210 is the placement of the 180 degree phase clear areas 213, it is much easier to inspect the masks after they have been manufactured.

The decreased complexity of the phase shift mask when compared to the combined mask disclosed in Spence also reduces the problem of design rule conflicts. As stated earlier, the combining of phase shift and structure elements on a single mask greatly increases the possible number of design rule conflicts that have to be sorted by the computer to come up with a mask design that will implement the desired shrunk circuit. This results in a much more complicated and time consuming process for the computer, and situations where a solution might not exist. The current invention overcomes these problems by separating the elements onto separate masks which greatly reduces the number of possible design conflicts on a single mask.

Lastly, the masks disclosed in Spence differ substantially from the old mask 100. This is a direct result of combining the phase shift and structure functions on one mask. One embodiment of the invention uses a structure mask 220 that appears very similar to the old mask 100. This is an advantage for integrated circuit designers in that they can visually do a double check of the mask design by comparing the structure mask 220 directly to the old mask 100.

In another embodiment of the invention a portion of the polysilicon circuit structure is included on the phase shift mask. Although less desirable than placing all of the structure on the structure mask, this would add flexibility to the process of mask design. For, in a situation where design rules prevent the design of a structure mask which includes all of the structure, it may be possible to include some of the needed structure on the phase shift mask.

c. Design Shrinking

Figure 3:
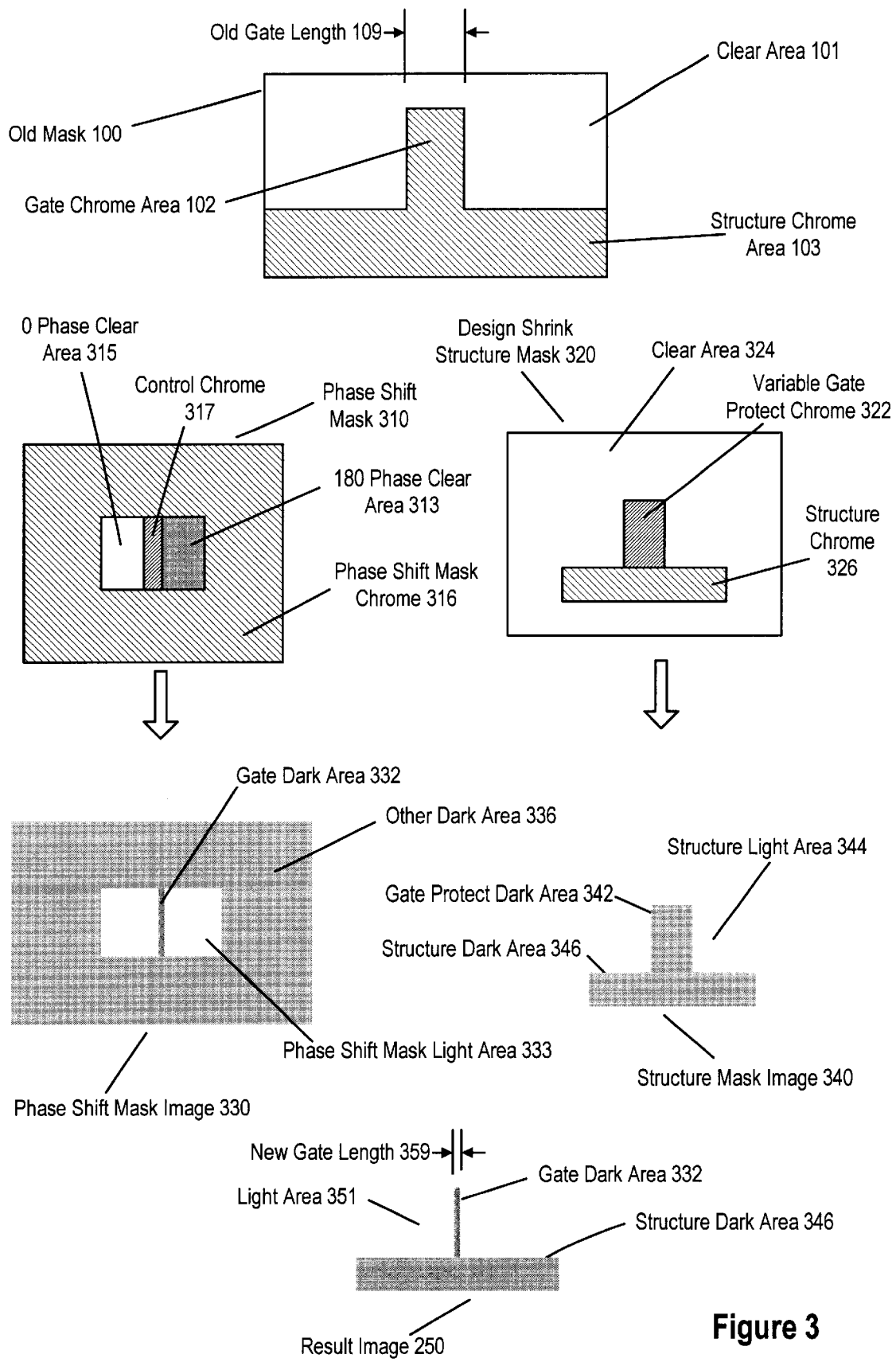
FIG. 3 illustrates one embodiment of a dual mask phase shifting process for shrinking an integrated circuit design.

FIG. 3 illustrates one embodiment of a dual mask phase shifting process for shrinking an integrated circuit design. The concepts applicable to FIG. 2 apply here as well, and as such the following discussion will focus on the differences between FIGS. 2 and 3.

FIG. 2 illustrated an embodiment solely for the shrinking of a circuit dimension that required interference, in the specific case, the gate length of all transistors in a circuit. FIG. 3 on the other hand is an embodiment of a process to shrink an entire integrated circuit design structure including the transistor gate lengths. For purposes of illustration of this embodiment, it is assumed that the chosen shrink factor for the circuit decreased only the transistor gate length to a dimension that required phase shifting. The remainder of the circuit is shrunk using conventional optical lithography methods to implement the design shrink. In another embodiment, the dual mask phase shifting may be used to shrink any area requiring interference.

d. Example Flowchart

Figure 4:
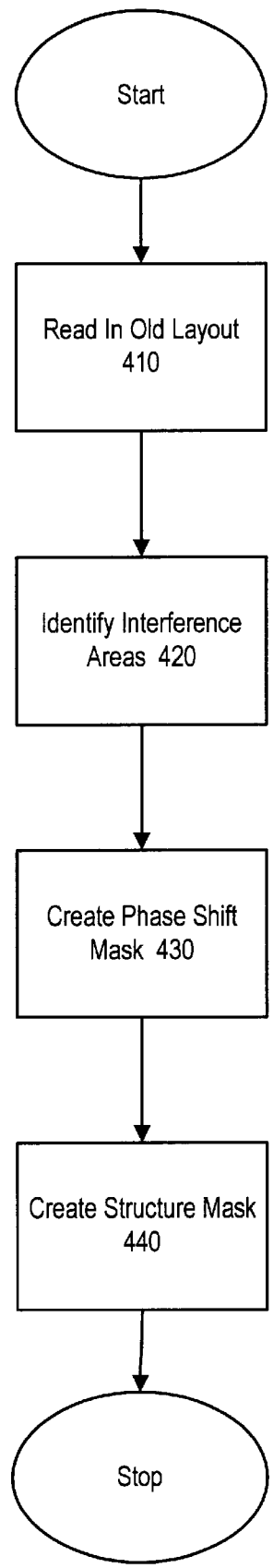
FIG. 4 illustrates one embodiment of a method of creating the masks found in FIGS. 2 and 3.

FIG. 4 illustrates one embodiment of a method of creating the mask found in FIGS. 2 and 3.

This embodiment of the method envisions that each block will be performed by a computer. However, this is not required, and the invention is not limited to a method in which each block is performed by a computer. For instance, a human could perform each of the design steps manually.

At block 410, a computer reads in data including old mask layout data that is supplied either manually or by reading files (e.g. a GDS-II file) preexisting in the computer. In one embodiment, this data will include a previous large dimension integrated circuit design, a new gate length dimension to be applied to all transistors in the integrated circuit design, and various other design rules needed for the design of the masks. In another embodiment, this data will include a previous large dimension integrated circuit design, a shrink factor dimension to be applied to the entire integrated circuit, and various other design rules needed for the design of the masks. In another embodiment, this data will include a previous large dimension integrated circuit design, a new gate length dimension to be applied to all transistors in the integrated circuit design, a shrink factor dimension to be applied to the remainder of the integrated circuit, and various other design factors needed for the design of the masks. In still another embodiment, this data will include a previous integrated circuit design with shrunk transistor gate lengths, a shrink factor to be applied to the remainder of the integrated circuit, and various other design factors needed for the design of the masks.

At block 420, the computer identifies areas on the new circuit design that have dimensions that are too small to be achieved by traditional optical lithography and that can be achieved through the use of destructive interference. As the limits for optical lithography may vary depending upon the application and the physical limits of the particular equipment, the exact quantity of this interference dimension is variable and may be supplied by the user at block 410 in addition to the other manufacturing process data.

At block 430, the computer creates a phase shift mask design by locating a phase shift area in each place in the circuit where the computer has previously identified there to be a need for an interference dimension. Each phase shift area includes adjacent clear areas that transmit light 180 degrees out of phase with each other, with the boundary between the areas falling where the interference dimension needs to be. This computer produced design data can then be input into a mask manufacturing device that will convert the design data into a physical mask.

At block 440, the computer creates a structure mask design. The computer analyzes the required circuit structure and designs the mask such that opaque areas appear everywhere that a polysilicon structure so requires. The computer will also design the structure mask such that opaque areas appear over each area that was previously determined to require a phase shift area. The width of this gate protect area is variable and sensitive to user input. The computer will also analyze the design to ensure that clear areas appear wherever needed to erase unwanted phase shift artifacts. This computer produced design data can then be input into a mask manufacturing device that will convert the design data into a physical mask. In one embodiment, the computer generates GDS-II data describing the phase shifting mask and the structure mask.

e. Design Rules

Figure 5:
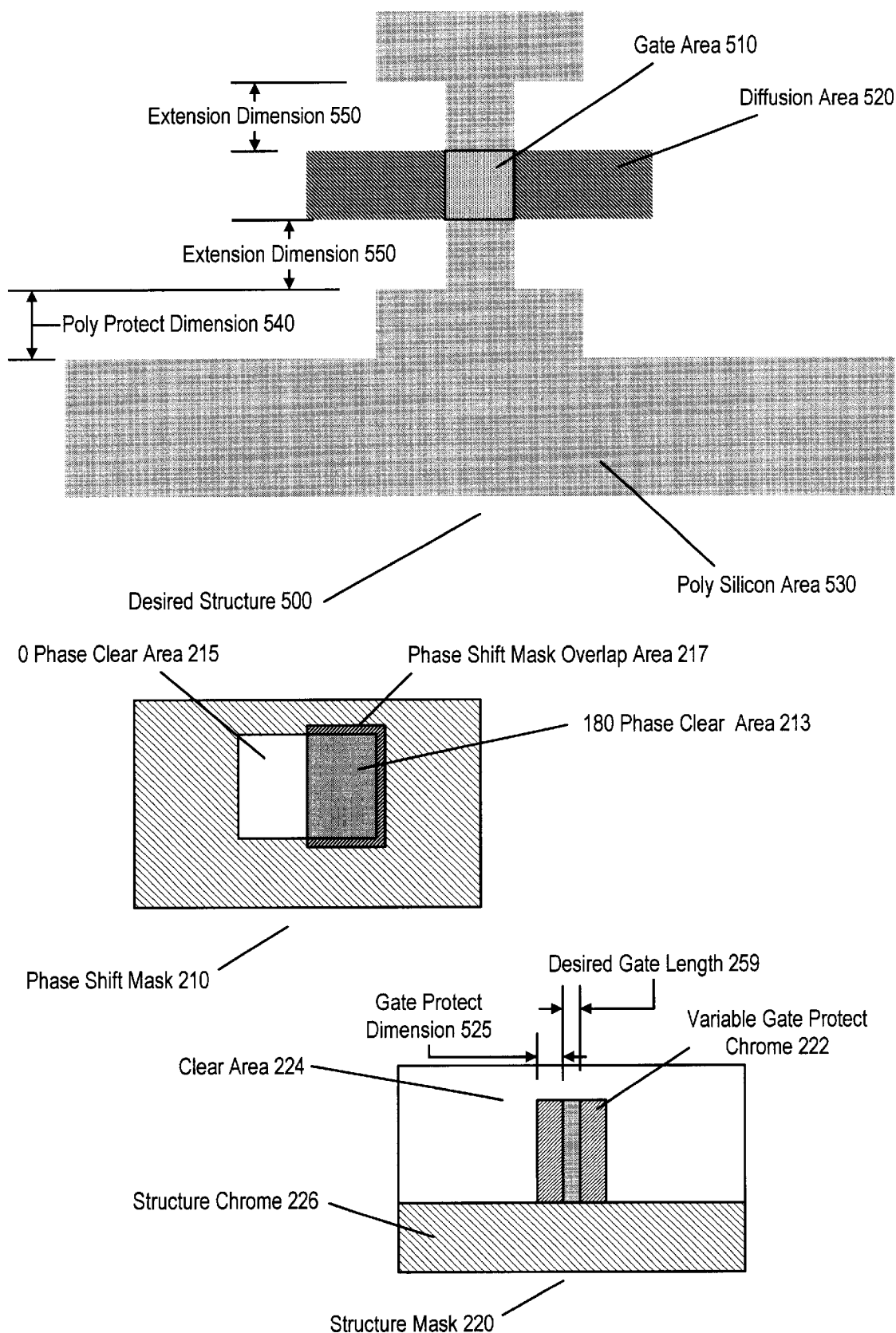
FIG. 5 illustrates one embodiment of a desired integrated circuit structure and effective design rules.

FIG. 5 illustrates one embodiment of a desired integrated circuit structure and effective design rules. FIG. 5 includes the following elements: a desired structure 500, a phase shift mask 210, and a structure mask 220. The desired structure 500 includes a gate area 510, a diffusion area 520, a polysilicon area 530, a poly protect dimension 540, and an extension dimension 550. The phase shift mask 210 includes a 180 degree phase clear area 213, a 0 degree phase clear area 215, and a phase shift mask overlap area 217. The structure mask 220 includes variable gate protect chrome 222, a clear area 224, structure chrome 226, desired gate length 259, and a gate protect dimension 525.

The actual phase shift mask design must take into account possible imperfections in the mask manufacturing process. These imperfections include mask misalignment and double exposure. Desired structure 500 represents the image of a design structure that takes into account the various dimensions that are required to be defined in order to avoid any problems that may be caused by these potential manufacturing imperfections.

One embodiment of the invention is designed to shrink transistor gate length. Thus, the mask must be designed such that the gate area 510 of the transistor is shrunk even if the masks are misaligned. To accomplish this, the phase shift areas on the phase shift mask are designed to be of a width that is equal to the width of the diffusion area 520 plus the two extension dimensions 550 shown in FIG. 5. The extension dimensions are a function of the maximum possible alignment error involved in the physical mask manufacturing process.

It is also required that the polysilicon area 530 be protected from any inadvertent exposure during the process. This is accomplished by providing the poly protect dimension 540 which is a function of the maximum possible alignment error. Thus in the actual mask design, no phase shift mask phase shift area will be of a width that is within the poly protect dimension 540 of any structure on the structure mask.

Phase shift mask 210 is the same as in FIG. 2 except that it shows phase shift mask overlap area 217. Here it is shown that the actual 180 degree phase clear area 213 is larger than the adjacent 0 degree phase clear area 215. This extra material is overlapped by the chrome of the mask, and thus the phase shift mask overlap area 217 does not allow light to transmit through. The size of the phase shift mask overlap area 217 is a function of physical manufacturing needs in putting the mask together.

Lastly, structure mask 220 is the same as in FIG. 2 except that it shows gate protect dimension 525 and desired gate length 259. The variable gate protect chrome 222 is designed to be of a width equal to the desired gate length 259 plus two times the gate protect dimension 525. The gate protect dimension is a function of possible mask misalignment. This dimension serves to ensure that the shrunken gate length produced by the phase shift mask is protected from subsequent inadvertent exposure.

f. Conclusion

What has been described is a method and apparatus for creating a phase shift mask and a structure mask for shrinking integrated circuit designs. In one embodiment, the phase shift mask is designed to create dark areas on a photoresist coated silicon wafer which correspond to a particular dimension requiring interference, specifically a shrunk transistor gate length. In another embodiment, the phase shift mask is designed to create dark areas on a photoresist coated silicon wafer which correspond to any desired dimension requiring interference. In each of these embodiments, the structure mask is designed to erase unwanted artifacts created by the phase shift mask, and to produce the remainder of the original polysilicon structure. In another embodiment, the phase shift mask is designed to create dark areas on a photoresist coated silicon wafer which correspond to any desired dimension requiring interference, while the structure mask is designed to erase unwanted artifacts, and to produce the remainder of the polysilicon structure in a shrunken form. In another embodiment, the structure mask is modified to compensate for additional design rules of the target technology. For example, allocations for mask misalignments may require that the second mask be modified slightly.

What is claimed is:

1. A set of masks for defining a layer of material in an integrated circuit, said set of masks comprising:
    a first mask having phase shifting areas in respective openings in an opaque field which define a first structure in said layer, the phase shifting areas include a first phase shift area and a second phase shift area, where destructive interference occurs between said first and second phase shift areas, and wherein said first phase shift area is aligned with said respective opening in said opaque field by a phase shift mask overlap area; and
    a second mask which defines other structure for said layer and for preventing erasure of said first structure.

2. The set of masks of claim 1, wherein the material of said layer includes polysilicon.

3. The set of masks of claim 1, wherein said first phase shift area has a relative phase shift of θ degrees and said second phase shift area has a relative phase shift of approximately θ+180 degrees.

4. A method for manufacturing integrated circuits, said integrated circuits including at least a layer of material, comprising:

exposing a semiconductor treated with material sensitive to radiation energy to said radiation energy using a first layout having phase shifting areas in respective openings in an opaque field for defining a first structure in said layer, the phase shifting areas include a first phase shift area, and a second phase shift area, where destructive interference occurs between said first phase shift area and said second phase shift area, and wherein said first phase shift area is aligned with said respective opening in said opaque field by a phase shift mask overlap area; and exposing the semiconductor to said radiation using a second layout which defines other structure in said layer, and prevents erasure of said first structure created by the first layout.

5. The method of claim 4, wherein the material of said layer includes polysilicon.

6. The method of claim 4, wherein said first phase shift area has a relative phase shift of θ degrees and said second phase shift area has a relative phase shift of approximately θ+180 degrees.

7. A method for producing a mask for small dimension transistor gates for a layout of a layer on an integrated circuit, comprising:

identifying a transistor gate in said layer for a transistor in said integrated circuit; defining phase shifting areas for defining a first structure in said layer, the first structure including said transistor gate;

providing a layout including said phase shifting areas in respective openings in an opaque field, the phase shifting areas include a first phase shift area, and a second phase shift area, where destructive interference occurs between said first phase shift area and said second phase shift area, and wherein said first phase shift area is aligned with said respective opening in said opaque field by a phase shift mask overlap area; and providing a second layout which defines other structure in said layer, and which prevents erasure of said transistor gate.

8. The method of claim 7, wherein the layer includes polysilicon.

9. The method of claim 7, wherein said first phase shift area has a relative phase shift of θ degrees and said second phase shift area has a relative phase shift of approximately θ+180 degrees.

10. A method for producing phase shifting layout data from a portion of an integrated circuit layout of a layer of material, the integrated circuit layout defining at least a transistor and an interconnect structure, at least some of the transistor and the interconnect structure in said layer, the transistor including a gate, the method comprising:

identifying using a data processor the layout data for a transistor gate in the integrated circuit layout;

generating the phase shifting layout data using at least the identified layout data for the transistor gate, the phase shifting layout data defining phase shifting areas in respective openings in an opaque field for defining a first structure in the material, the first structure including the transistor gate, the phase shifting areas include a first phase shift area, and a second phase shift area, where destructive interference occurs between said first phase shift area and said second phase shift area, and wherein said first phase shift area is aligned with said respective opening in said opaque field by a phase shift mask overlap area; and wherein the phase shifting layout data is adapted to be used in conjunction with a second layout data, the second layout data defining other structure in the material, and preventing erasure of the transistor gate.

11. The method of claim 10, wherein the material includes polysilicon.

12. The method of claim 10, wherein said first phase shift area has a relative phase shift of θ degrees and said second phase shift area has a relative phase shift of approximately θ+180 degrees.

13. A system for producing phase shifting layout data, the system comprising:

an integrated circuit layout, the integrated circuit layout defining at least a transistor and an interconnect structure, at least some of the transistor and the interconnect structure being formed by the same type of integrated circuit device material, the transistor including a gate; and a computer for identifying the data in the integrated circuit layout corresponding to the gate and for generating the phase shifting layout data using at least the identified gate, the phase shifting layout data defining phase shifting areas in respective openings in an opaque field for defining a first structure in the material, the first structure including the gate, the phase shifting areas include a first phase shift area, and a second phase shift area, where destructive interference occurs between said first phase shift area and said second phase shift area, and wherein said first phase shift area is aligned with said respective opening in said opaque field by a phase shift mask overlap area, and wherein the phase shifting layout data is adapted to be used in conjunction with a second layout data, the second layout data defining the other structure and protecting the first structure in the material in subsequent processes.

14. The system of claim 13, wherein the layer includes polysilicon.

15. The system of claim 13, wherein said first phase shift area has a relative phase shift of θ degrees and said second phase shift area has a relative phase shift of approximately θ+180 degrees.

16. A system for producing phase shifting layout data, the system comprising:

means for defining an integrated circuit layout, the integrated circuit layout defining at least a transistor and an interconnect structure, at least some of the transistor and the interconnect structure being formed by the same type of integrated circuit device material, the transistor including a gate; and means for identifying the data in the integrated circuit layout corresponding to the gate and for generating the phase shifting layout data using at least the identified gate, the phase shifting layout data defining phase shifting areas respective openings in an opaque field for defining a first structure in the material, the first structure including the gate, the phase shifting areas include a first phase shift area, and a second phase shift area, where destructive interference occurs between said first phase shift area and said second phase shift area, and wherein said first phase shift area is aligned with said respective opening in said opaque field by a phase shift mask overlap area, and wherein the phase shifting layout data is adapted to be used in conjunction with a second layout data, the second layout data defining other structure in the material and preventing erasure of the transistor gate.

17. The system of claim 16, wherein the layer includes polysilicon.

18. The system of claim 16, wherein said first phase shift area has a relative phase shift of θ degrees and said second phase shift area has a relative phase shift of approximately θ+180 degrees.

19. A system for producing a mask for small dimension transistor gates for a layout of a layer on an integrated circuit, comprising:

means for identifying a transistor gate in said layer for a transistor in said integrated circuit;

means for defining phase shifting areas in respective openings in an opaque field for defining a first structure in said layer, the phase shifting areas include a first phase shift area, and a second phase shift area, where destructive interference occurs between said first phase shift area and said second phase shift area, and wherein said first phase shift area is aligned with said respective opening in said opaque field by a phase shift mask overlap area, the first structure including said transistor gate having a smaller dimension; and means for providing a layout of a first mask including said phase shifting areas, said first mask adapted to be used in conjunction with a second layout for use on a mask, said second layout defining other structure in said layer and protecting the transistor gate from erasure.

20. The system of claim 19, wherein the layer includes polysilicon.

21. The system of claim 19, wherein said first phase shift area has a relative phase shift of θ degrees and said second phase shift area has a relative phase shift of approximately θ+180 degrees.

22. A method for manufacturing a set of masks, comprising:

reading a layout file for a mask set designed for integrated circuit components having first critical dimensions;

creating phase shift mask layout file having phase shift areas in respective openings in an opaque field to shrink the first critical dimensions to second critical dimensions for particular components of the integrated circuit components in a layer of material to define active regions having the second critical dimensions, the phase shifting areas include a first phase shift area, and a second phase shift area, where destructive interference occurs between said first phase shift area and said second phase shift area, and wherein said first phase shift area is aligned with said respective opening in said opaque field by a phase shift mask overlap area; and creating a second mask layout file defining other structure in said layer; and manufacturing at least one mask using the phase shift mask layout file and the trim mask layout file.

23. The method of claim 22, wherein the layer includes polysilicon.

24. The method of claim 22, wherein said first phase shift area has a relative phase shift of θ degrees and said second phase shift area has a relative phase shift of approximately θ+180 degrees.

* * * * *